US011825672B2

(12) United States Patent
Zampetti et al.

(10) Patent No.: US 11,825,672 B2
(45) Date of Patent: Nov. 21, 2023

(54) QUANTUM DOT LIGHT-EMITTING APPARATUS FOR ENHANCING QD CHARGE BALANCE

(71) Applicant: Sharp Display Technology Corporation, Kameyama (JP)

(72) Inventors: Andrea Zampetti, Abingdon (GB); Valerie Berryman-Bousquet, Chipping Norton (GB)

(73) Assignee: Sharp Display Technology Corporation, Kameyama (JP)

( * ) Notice: Subject to any disclaimer, the term of this patent is extended or adjusted under 35 U.S.C. 154(b) by 170 days.

(21) Appl. No.: 17/405,301

(22) Filed: Aug. 18, 2021

(65) Prior Publication Data
US 2023/0055560 A1    Feb. 23, 2023

(51) Int. Cl.
| | |
|---|---|
| *H10K 50/115* | (2023.01) |
| *H10K 50/805* | (2023.01) |
| *H10K 71/00* | (2023.01) |
| *H10K 50/15* | (2023.01) |
| *H10K 50/16* | (2023.01) |
| *H10K 102/00* | (2023.01) |

(52) U.S. Cl.
CPC ......... *H10K 50/115* (2023.02); *H10K 50/805* (2023.02); *H10K 71/00* (2023.02); *H10K 50/15* (2023.02); *H10K 50/16* (2023.02); *H10K 2102/00* (2023.02)

(58) Field of Classification Search
CPC .... H10K 50/115; H10K 50/805; H10K 71/00; H10K 50/15; H10K 50/16; H10K 2102/00; H10K 50/155; H01L 51/502; H01L 51/5203; H01L 51/56; H01L 51/5056; H01L 51/5072; H01L 2251/303
See application file for complete search history.

(56) References Cited

U.S. PATENT DOCUMENTS

| | | | | |
|---|---|---|---|---|
| 5,537,000 | A * | 7/1996 | Alivisatos | B82Y 30/00 313/499 |
| 7,651,674 | B2 * | 1/2010 | Jun | C09K 11/565 977/773 |
| 9,812,004 | B1 * | 11/2017 | Boshernitzan | G08C 17/02 |
| 9,831,706 | B2 * | 11/2017 | MacWilliams | H02J 7/32 |

(Continued)

OTHER PUBLICATIONS

Genichi Motomura et al., "Improvement of electroluminescent characteristics in quantum dot light-emitting diodes using ZnInP/ZnSe/ZnS quantum dots by mixing an electron transport material into the light-emitting layer", AIP Advances 10, 065228 (2020), https://doi.org/10.1063/5.0010203.

*Primary Examiner* — Caleb E Henry
(74) *Attorney, Agent, or Firm* — ScienBiziP, P.C.

(57) ABSTRACT

A quantum dot light-emitting apparatus includes a substrate, with a first electrode layer located on the substrate. An emissive layer having a first set of quantum dots is electrically coupled with the first electrode layer, and a second electrode layer is also electrically coupled with the emissive layer. The second electrode layer is located opposite the first electrode layer, relative to the emissive layer. A first charge transport layer is placed between the emissive layer and the first electrode layer, and a second charge transport layer is placed between the emissive layer and the second electrode layer. At least one of the first charge transport layer and the second charge transport layer includes a second set of quantum dots.

19 Claims, 12 Drawing Sheets

(56) References Cited

U.S. PATENT DOCUMENTS

| | | | |
|---|---|---|---|
| 9,874,693 B2* | 1/2018 | Baiocco | H01L 21/762 |
| 10,581,007 B2 | 3/2020 | Angioni et al. | |
| 2006/0039850 A1* | 2/2006 | Jun | C09K 11/08 |
| | | | 423/561.1 |
| 2010/0140586 A1* | 6/2010 | Char | C09K 11/883 |
| | | | 257/14 |
| 2012/0280345 A1* | 11/2012 | Zhu | G02B 6/1226 |
| | | | 257/E31.127 |
| 2013/0037778 A1* | 2/2013 | Kazlas | C09K 11/883 |
| | | | 257/E29.024 |
| 2014/0027816 A1* | 1/2014 | Cea | H01L 29/1054 |
| | | | 257/E29.085 |
| 2014/0197507 A1* | 7/2014 | Assefa | H01L 31/0745 |
| | | | 438/69 |
| 2015/0091093 A1* | 4/2015 | Bouche | H01L 27/092 |
| | | | 257/369 |
| 2015/0268417 A1* | 9/2015 | Assefa | H01L 27/1461 |
| | | | 385/14 |
| 2016/0027848 A1* | 1/2016 | Liu | H10K 50/8426 |
| | | | 257/40 |
| 2018/0254421 A1* | 9/2018 | Kinge | H10K 85/60 |
| 2018/0309078 A1* | 10/2018 | Ju | H10K 50/115 |
| 2018/0351125 A1* | 12/2018 | He | H10K 71/00 |
| 2023/0105598 A1* | 4/2023 | Kim | H10K 59/38 |
| | | | 257/40 |
| 2023/0139500 A1* | 5/2023 | Kim | G02F 1/133614 |
| | | | 362/84 |
| 2023/0192975 A1* | 6/2023 | Wang | C08L 1/02 |
| | | | 428/220 |

* cited by examiner

QUANTUM DOT LIGHT-EMITTING APPARATUS FOR ENHANCING QD CHARGE BALANCE

FIELD

The present disclosure relates to light-emitting devices, and more specifically to highly efficient light-emitting devices (e.g., by having an emissive layer containing quantum dots and one or more charge transport materials blended with a defined quantity of quantum dots). The light-emitting devices may be implemented in display applications, for example, high-resolution, multicolor displays. The present disclosure further relates to methods of manufacturing said light-emitting devices and the arrangements thereof.

BACKGROUND

Quantum dots (QDs) are nanocrystalline semiconductor materials that may include a core, a shell, and ligand structures. A feature of QDs is the quantum confinement effect, by which a wavelength of light emitted from the QDs depends on QD size. Additionally, QDs can emit light with greater color purity and generate light with higher internal quantum efficiency (IQE) compared to other light-emitting devices, such as organic semiconductors. These properties have attracted a great deal of attention in applying QDs to optoelectronic devices, such as light-emitting devices.

A conventional QD-LED may include a QD light-emitting EML sandwiched between a hole transport layer (HTL) and an electron transport layer (ETL). The charge injection from the ETL to the EML is generally efficient in QD-LEDs due to a good match between the conduction band (CB) of the ETL and the CB of the QD layers. However, QD-LEDs generally suffer from relatively poor hole injection from the HTL to the EML.

This poor hole injection is usually a consequence of both a significant energy barrier at the interface between the HTL and the QDs of the EML, whose valence band (VB) can reach up to 7 eV, and due to the use of organic ligands that are generally insulating. The result is an inefficient charge balance into the EML. Two issues related to this unbalanced charge are charge accumulation at the interface of a charge transport layer (CTL) (e.g., the HTL) and QDs of the EML, and charge percolation throughout the EML from one CTL (e.g., the HTL) to the opposite CTL (e.g., the ETL), leading to a significant quenching of radiative emission. These factors contribute to both current leakage across the device structure, and a decrease in the efficiency of such devices.

Therefore, a key challenge is to achieve QDs with an enhanced charge balance to prevent current leakage across the structure. Several strategies have been investigated and developed for electron injection from the ETL into the QDs to compensate for the less efficient hole injection mechanism. Such strategies include engineered hole transport materials, and the addition of charge blocking layers at the interface with the EML. Most strategies to overcome this drawback involve engineered QDs, HTLs and ETLs, or the insertion of a charge blocking layer between the QDs and a CTL. Most of these strategies require additional steps in the fabrication process or add more complexity to the chemical design and synthesis of HTLs, ETLs or QDs.

Thus, there is a need for improved QD-LED performance and efficiency.

SUMMARY

In accordance with one aspect of the present disclosure, a QD-LED apparatus includes a substrate, with a first electrode layer disposed on the substrate. An EML bearing a first set of QDs is electrically coupled with the first electrode layer. A second electrode layer is also electrically coupled with the EML. The second electrode layer may be disposed opposite the first electrode layer, relative to the EML. A first CTL is disposed between the EML and the first electrode layer, and a second CTL is disposed between the EML and the second electrode layer. At least one of the first CTL and the second CTL includes a second set of QDs.

In one implementation, the QDs in the first set of QDs and the second set of QDs may be structurally the same. In another implementation, a QD concentration in at least one of the first CTL and the second CTL may range from 0.1 wt % to 20 wt %. In another implementation, at least one of the first CTL and the second CTL includes an organic semiconductor. The organic semiconductor may be configured to have hole transport properties. Alternatively, the organic semiconductor may be configured to have electron transport properties.

In another implementation, at least one of the first CTL and the second CTL may include an inorganic semiconductor. The inorganic semiconductor may be configured to have hole transport properties. The hole transport properties may be conferred by hole-transporting metal-oxide nanoparticles, including a metal selected from Group V, Group VI, Group IX, Group X, or Group XI. Alternatively, the inorganic semiconductor may be configured to have electron transport properties. The electron transport properties may be conferred by electron-transporting metal-oxide nanoparticles, including a metal selected from Group I, Group IV, Group XII, Group XIII, or Group XIV. The inorganic semiconductor may include metal-oxide nanoparticles having a nanoparticle size ranging from 3-nm to 20-nm. Additionally, at least one of the first CTL and the second CTL may comprise metal-oxide nanoparticles equal in size to or smaller than QDs of the second set of QDs.

In another implementation, at least one of the first CTL and the second CTL may comprise a plurality of charge transport sub-layers. Each of the plurality of charge transport sub-layers may feature metal-oxide nanoparticles of a different size. Alternatively, the plurality of charge transport sub-layers may be deposited in ascending order according to an electron-transporting metal-oxide nanoparticle size of each charge transport sub-layer. In one implementation, at least one of the first CTL and the second CTL may comprise a blend of nanoparticles having different nanoparticle sizes. In another implementation, at least one nanoparticle of the blend of nanoparticles may comprise a metal-oxide nanoparticle of a size equal to or smaller than QDs in the second set of QDs.

In some implementations, the second set of QDs may be randomly dispersed in at least one of the first CTL and the second CTL. Alternatively, in other implementations, the second set of QDs have a graduated dispersion in at least one of the first CTL and the second CTL.

BRIEF DESCRIPTION OF THE DRAWINGS

Aspects of the exemplary disclosure are best understood from the following detailed description when read with the accompanying figures. Various features are not drawn to scale, and dimensions of various features may be arbitrarily increased or reduced for clarity of discussion.

DETAILED DESCRIPTION

Figure 1:
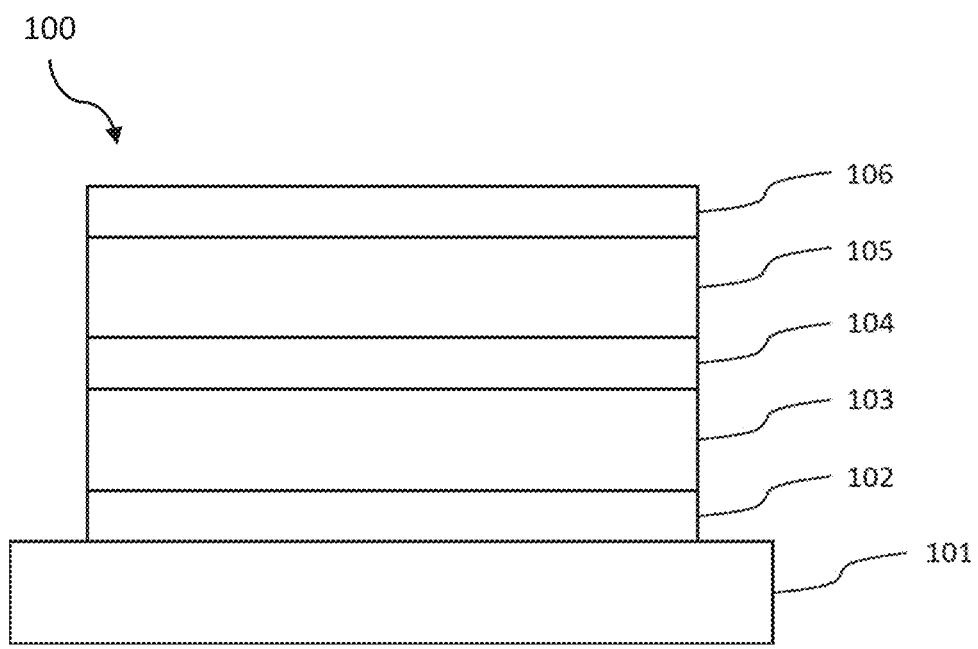
FIG. 1 illustrates an elevation view of a conventional diode of a conventional QD-LED structure.

The following description contains specific information pertaining to exemplary implementations of the present disclosure. The drawings in the present disclosure and their accompanying detailed description are directed to merely exemplary implementations. However, the present disclosure is not limited to merely these exemplary implementations. Other variations and implementations of the present disclosure will occur to those skilled in the art. Unless noted otherwise, like or corresponding elements among the figures may be indicated by like or corresponding reference numerals. Moreover, the drawings and illustrations in the present disclosure are generally not to scale and are not intended to correspond to actual relative dimensions.

For consistency and ease of understanding, like features are identified (although, in some examples, not shown) by numerals in the exemplary figures. However, the features in different implementations may differ in other respects, and thus shall not be narrowly confined to what is shown in the figures.

The description uses the phrases "in one implementation," or "in some implementations," which may each refer to one or more of the same or different implementations. The term "coupled" is defined as connected, whether directly or indirectly through intervening components, and is not necessarily limited to physical connections. The term "comprising," when utilized, means "including, but not necessarily limited to"; it specifically indicates an open-ended inclusion or membership in the so-described combination, group, series, and the equivalent.

Additionally, for purposes of explanation and non-limitation, specific details, such as functional entities, techniques, protocols, standards, and the like, are set forth for providing an understanding of the described technology. In other examples, detailed description of well-known methods, technologies, system architectures, and the like are omitted so as not to obscure the description with unnecessary details.

Implementations of the present disclosure will now be described with reference to the drawings in which reference numerals are used to refer to like elements throughout. It will be understood that the figures are not necessarily to scale.

The present disclosure describes an enhanced QD-LED layer structure and related methods of fabricating such a structure that improve the charge balance within the EML by incorporating QDs in at least one of the CTLs. Exemplary structures are disclosed which may provide both improved QD and ETL interface and enhanced charge balance into a QD-LED EML.

Referring to FIG. 1, an exemplary light-emitting diode (LED) 100 is shown. An LED 100 may include a substrate 101, a first electrode 102, a first CTL 103, an EML 104, a second CTL 105 and a second electrode 106. Additional layers may be present between an electrode and the EML 104, such as one or more charge injection layers, charge transport layers and charge blocking layers. This disclosure describes a "direct" (also called a "standard" or "conventional") structure in which the first electrode 102 is closer to the substrate 101 and is an anode, and any layers (e.g., first CTL 103) between the anode (first electrode 102) and the EML 104 are hole transporting layers (HTLs), hole injecting layers (HILs) or electron blocking layers (EBLs). Accordingly, the second electrode 106 is further from the substrate 101 and is a cathode, and any layers (e.g., second CTL 105) between the cathode (second electrode 106) and the EML 104 are ETLs, electron injecting layers (EILs), electron blocking layers (EBLs), or hole blocking layers (HBLs).

When an electrical bias is applied to the LED 100, holes (not shown) are transported from the anode (e.g., first electrode 102) and injected into the EML 104, and electrons (not shown) are conducted from the cathode (e.g., second electrode 106) and injected into the EML 104. Holes and electrons radiatively recombine in the EML 104 at either an organic semiconductor material or QDs, generating light. Radiative recombination refers to direct band-to-band transitions of an electron from the conduction band (or lowest occupied molecular orbital (LUMO), if an organic semiconductor) to the valence band (or highest occupied molecular orbital (HOMO), if an organic semiconductor) of the inorganic semiconductor while emitting a photon. Some of this light is emitted out of the LED 100 structure where it may be perceived by an external viewer, thereby providing a light-emitting device. Light may be emitted through the substrate 101, in which case the LED 100 is called "bottom-emitting", or may be emitted opposite the substrate 101, in which case the device is called "top-emitting."

The first CTL 103 (e.g., HTL), EML 104, and second CTL 105 (e.g., ETL) layers may be solution-processed, and thin films can be formed by any suitable method including (but not limited to) spin coating, blade coating, inkjet printing, wire bar coating, slot die coating, gravure printing, screen printing and drop casting.

Still referring to FIG. 1, the substrate 101 may be made from any suitable material(s). Exemplary substrates may include glass substrates and polymer substrates. More specific examples of substrate material(s) include polyimides, polyethenes, polyethylenes, polyesters, polycarbonates, polyethersulfones, polypropylenes, and/or polyether ether ketones. The substrate 101 may be any suitable shape and size. The first CTL 103 (e.g., HTL) may include one or more layers configured to transport holes through from the first electrode 102 (e.g., anode) to the EML 104. The first CTL 103 (e.g., HTL) may be made from any suitable material(s). In an inverted structure, the second CTL 105 would be the HTL.

In certain implementations, the HTL, first CTL 103 (or second CTL 105 if inverted), may include one or more of poly(3,4-ethylenedioxythiophene):poly(styrenesulfonate) (PEDOT:PSS), poly(9,9-dioctylfluorene-co-N-(4-sec-butylphenyl)-diphenylamine) (TFB), poly(9-vinylcarbazole) (PVK), poly(N,N'-bis(4-butylphenyl)-N,N'-bisphenyl-benzidine) (poly-TPD), metal oxide materials (e.g., $V_2O_5$, NiO, CuO, $WO_3$, and/or $MoO_3$), and organic small molecule materials (e.g., 2,3,5,6-tetrafluoro-7,7,8,8-tetracyanoquinodimethane (F4TCNQ), 1,4,5,8,9,11-hexaazatriphenylene-hexacarbonitrile (HATCN), N4,N4'-Bis(4-(6-((3-ethyloxetan-3-yl)methoxy)hexyl)phenyl)-N4,N4'-diphenylbiphenyl-4,4'-diamine (OTPD), N4,N4'-Bis(4-(6-((3-ethyloxetan-3-yl)methoxy)hexyloxy)phenyl)-N4,N4'-bis(4-methoxyphenyl)biphenyl-4,4'-diamine (QUPD), and/or N,N'-(4,4'-(cyclohexane-1,1-diyl)bis(4,1-phenylene))bis (N-(4-(6-(2-ethyloxetan-2-yloxy)hexyl)phenyl)-3,4,5-trifluoroaniline) (X-F6-TAPC)).

In implementations where the HTL (e.g., first CTL 103 (or second CTL 105, if inverted)) includes more than one layer, the material of one of the respective layers may differ from the material of one or more of the other layers. In other implementations where the CTL 103 includes more than one layer, the material of the respective layers may be the same. The ETL (e.g., second CTL 105 (or first CTL 103, if inverted)) may include metal oxides such as ZnO, $Mg_xZn_{1-x}O$ where $0 \leq x \leq 1$, $Al_xZn_{1-x}O$ where $0 \leq x \leq 1$, $Ga_xZn_{1-x}O$ where $0 \leq x \leq 1$, and $Li_xZn_{1-x}O$ where $0 \leq x \leq 1$, $SnO_2$, $TiO_2$ and $ZrO_2$.

Figure 2A:
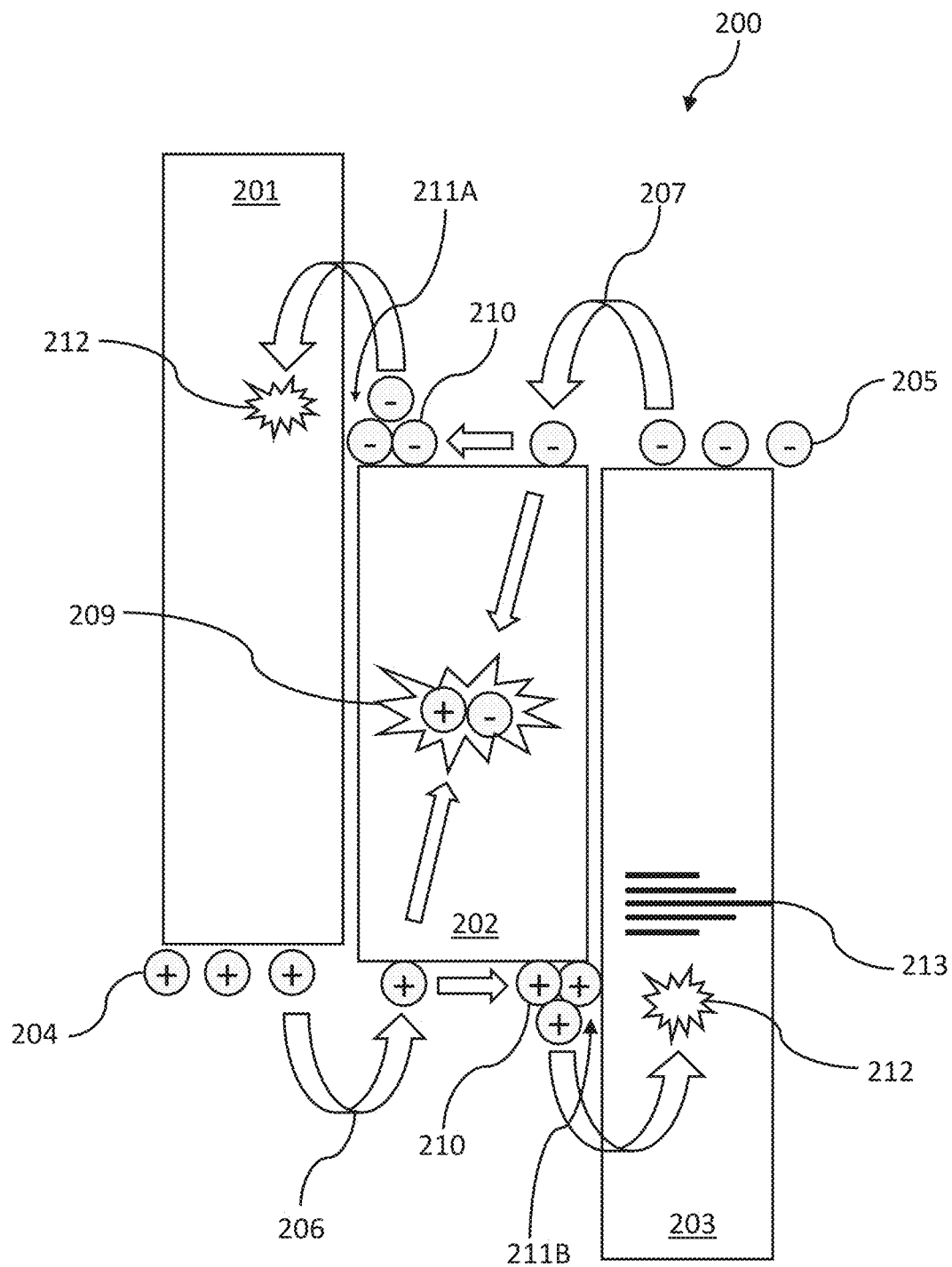
FIG. 2A illustrates an energy level diagram of a CTL/EML portion of a conventional QD-LED structure.
Figure 2B:
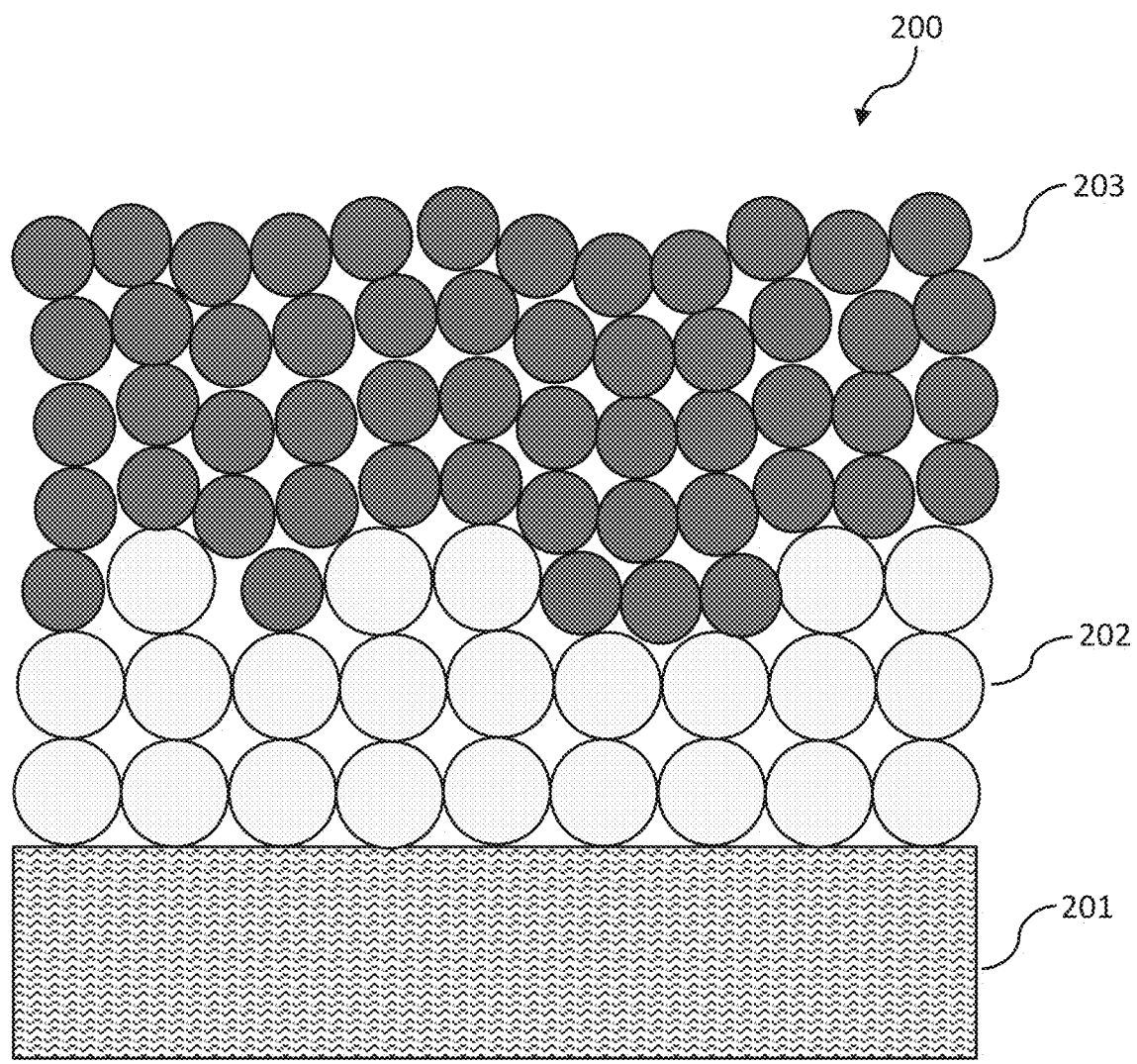
FIG. 2B illustrates a cut-away elevation view of a portion of a CTL/EML interface of a conventional QD-LED structure.

Referring to FIGS. 2A and 2B, a CTL/EML interface of a conventional QD-LED 200 is shown, including an HTL 201, an EML 202, and an ETL 203. FIG. 2A illustrates an energy level diagram showing charge injection in which holes 204 and electrons 205 from both CTLs (e.g., HTL 201 and ETL 203) move into the EML 202 with unequal efficiency. In particular, the hole injection 206 from the HTL 201 into the EML 202 is usually less efficient than the electron injection 207 from ETL 203 into the EML 202.

Some of the charges (e.g., holes 204 and electrons 205) radiatively recombine within QDs of the EML 202 and generate photons 209, but some charges 210 will continue to penetrate across the EML 202 by accumulating at the interface of the opposite CTL (e.g., HTL 201 and ETL 203). This mechanism leads to the illustrated charge accumulation and unbalanced charge injections. In some examples, a fraction of accumulated charges 210 at an HTL/EML interface 211A and/or an ETL/EML interface 211B may be quenched via non-radiative recombination 212 with the charge accumulating in the CTL (e.g., HTL 201 and ETL 203) or with defect states 213 of the CTLs. This recombination may generate a current leakage across the structure, thus degrading operation (e.g., creating high driving voltages and currents, low efficiencies, and a short device lifespan). FIG. 2B shows an example of the layer structure of the HTL 201, EML 202, and ETL 203 illustrated in the diagram of FIG. 2A.

Figure 3:
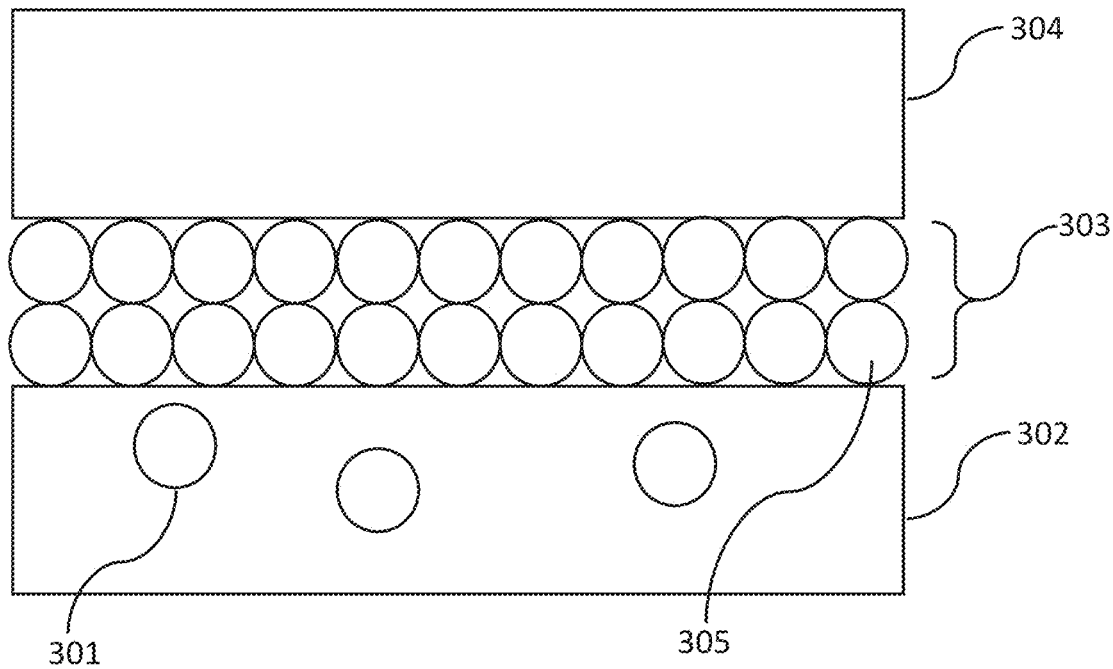
FIG. 3 illustrates a cut-away elevation view of a portion of a QD-LED structure with QDs incorporated into one of the CTLs in accordance with an exemplary implementation of the present disclosure.

Referring to FIG. 3, a small quantity of QDs 301 may be incorporated into at least one of the CTLs (e.g., first CTL 302 or second CTL 304) (in this case, the first CTL 302). QDs 301 may act as radiative recombination states for the excess of charge moving from the opposing second CTL 304 across the EML 303. The first CTL 302 or second CTL 304 may include organic or inorganic semiconductors. In the case of inorganic nanoparticle (NP) semiconductors, such as metal-oxide NPs, it may be desirable that the NP size be equal to or smaller than 5 nm, or a blend of CTL NPs with different NP sizes in which at least one set of ETL NPs are smaller than 5 nm. This is mainly because CTL NPs with smaller size of QDs (usually >5 nm) allows the improvement of the uniformity of the QD layer by passivating the emissive layer defects. In certain implementations, two or more consecutive CTL layers may be deposited on the bottom and/or the top of the EML 303.

A solvent selected to deposit and/or blend QDs into at least one of the CTLs (e.g., first CTL 302 or second CTL 304) may feature a miscibility compatibility with that of the one or more CTL dispersions. Exemplary solvents may include, but are not limited to, chloroform, linear or branched alkanes (e.g., pentane, hexane, heptane, octane, nonane, decane, undecane, dodecane), linear or branched alcohols (e.g., butanol, 2-propanol, propanol, ethanol, methanol), mono-, di- and tri-halogen-substituted benzenes (e.g., chlorobenzene, 1,2-dibromobenzene, 1,3-dibromobenzene, 1,4-dibromobenzene, 1,3,5-tribromobenzene, 1,2,4-tribromobenzene), linear or branched ethers, and/or mono-, di- and tri-alkyl-substituted benzenes (e.g., toluene, 1,2-Dimethylbenzene, 1,3-Dimethylbenzene, 1,4-Dimethylbenzene).

In some implementations, QD solvent exchange may be employed to transfer QDs in a suitable solvent (e.g., a solvent that is miscible with a solvent used to disperse CTL compounds). In some implementations, the QDs may be the same of those of the EML 303. In some other implementations, the QDs may vary from those of the emissive layers. The QD concentration in a CTL solution may range from 0.1 to 20 wt %. The concentration of CTL material in solution may range from 0.1 to 20 wt %. A dispersant, stabilizing agent or additive may be added to the dispersion to increase the chemical stability of the formulation. In some implementations, QD nanoparticles incorporated into a CTL (e.g., first CTL 302 or second CTL 304) may be thermally treated with a temperature ranging from 60° C. to 210° C. after deposition. In some implementations, QDs incorporated into a CTL (e.g., first CTL 302 or second CTL 304) may not be treated after deposition. In some other implementations, QDs incorporated in CTL may be vacuum dried at different temperatures starting from room temperature up to 210° C. The annealing length in these embodiments may vary from 30 seconds up to 12 hours.

There are several potential advantages to the disclosed arrangement. First, radiative recombination may be improved by widening the region of the structure where holes and electrons may radiatively recombine. Additionally, gradual QD distribution across the structure may lead to a decrease of current leakage and driving voltage, an increase of charge injection efficiency (e.g., higher internal quantum efficiency), and an improvement of charge balance. Finally, QD-LEDs with an enhanced charge balance may have a reduced charge accumulation across the structure by increasing the lifetime of the devices.

Figures 4A, 4B:
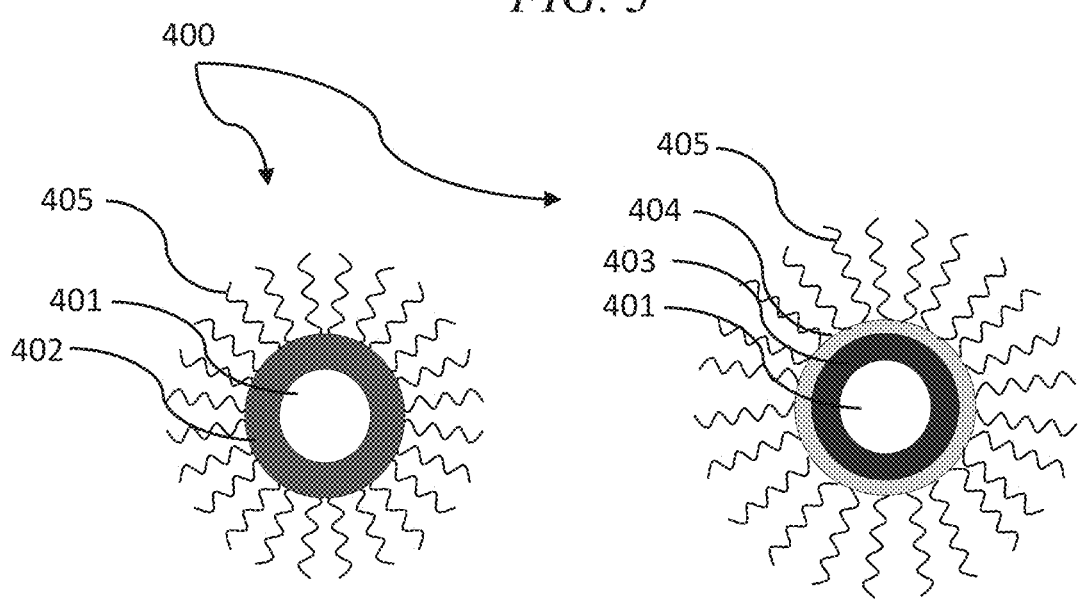
FIG. 4A illustrates a diagram of a conventional single core-shell QD in accordance with an exemplary implementation of the present disclosure.
FIG. 4B illustrates a diagram of a conventional core-multiple shell QD in accordance with an exemplary implementation of the present disclosure.

Referring to FIG. 4A, schematic diagrams of a quantum dot 400 are shown. Examples of quantum dot cores 401 and shells 402 may include one or more of: InP, CdSe, CdS, $CdSe_xS_{1-x}$, CdTe, $Cd_xZn_{1-x}Se$, $Cd_xZn_{1-x}Se_yS_{1-y}$, ZnSe, ZnS, ZnSTe, ZnSeTe, perovskites of the form $ABX_3$, $Zn_w Cu_zIn_{1-(w+z)}S$, and carbon, where $0 \leq w, x, y, z \leq 1$ and $(w+z) \leq 1$. The formed core 401 and shell 402 may be surrounded by ligands 405. The ligands 405 may passivate crystal defects in the core-shell quantum dot 400, and in some implementations may provide for improved solubility in some solvents as well as to transport the charge from CTLs to the EML. Exemplary implementations of ligands 405 are long chain organic ligands, short chain organic ligands, inorganic molecular ligands and/or inorganic ion ligands.

In one exemplary embodiment, the outer surface of the QDs 400 may be bonded with electron transport ligands 405. These ligands 405 have electron conducting properties to improve the injection of electrons from an ETL (not shown) to the QD 400 surface. Exemplary electron transport ligands 405 may include alkyl, alkenyl, alkynyl or aryl (linear, branched, or cyclic), carboxylic acids, unsaturated and saturated acids (e.g., octainoic acids, dodecanoic acids, oleic acids), and the like. Other implementations of the ligands 405 can include compounds such as phosphate, phosphinite or thiolate groups. Exemplary inorganic molecular ligands may include metal-organic complexes and the like. Exemplary inorganic ion ligands may include transition metals (e.g., $Zn^+$), and the like.

In other exemplary implementations, the outer surface of a QD 400 may be bonded with hole transport ligands 405. These ligands 405 have hole conducting features to efficiently transport the positive charge carriers from an HTL (not shown) to the QD 400 surface. Exemplary hole transport ligands 405 may include alkyl, alicyclic, aromatic, tertiary, ethylene (linear or branched) amines with 1 to 20 atoms of carbon; mono-valent (or di- or tri-valent) alkyl, -alkenyl, -alkynyl or aryl (linear, branched, or cyclic) phosphine or phosphine oxides with 1 to 60 atoms of carbon; alkyl, -alkenyl, -alkynyl or aryl (linear, branched, or cyclic) thiols with 1 to 30 atoms of carbon; and the like. Exemplary inorganic molecular ligands may include metal-organic complexes and the like. Exemplary inorganic ion ligands may include halides (e.g., $I^-$, $Br^-$ and $Cl^-$), chalcogenides (e.g., $S^-$, $Se^-$, $Te^-$), thiocyanate ($SCN^-$).

Exemplary solvents for dispersing QDs 400 may include, but are not limited to, acetone, dichloromethane, chloroform, ethyl acetate, linear or branched alkanes (e.g., pentane, hexane, heptane, octane, nonane, decane, undecane, dodecane), linear or branched alcohols (e.g., butanol, 2-propanol, propanol, ethanol, methanol), linear or branched alkoxy alcohols (e.g., 2-methoxyethanol, 2-ethoxyethanol), mono-, di- and tri-halogen-substituted benzenes (e.g., chlorobenzene, 1,2-dibromobenzene, 1,3-dibromobenzene, 1,4-dibromobenzene, 1,3,5-tribromobenzene, 1,2,4-tribromobenzene), linear or branched ethers, and/or mono-, di- and tri-alkyl-substituted benzenes (e.g., toluene, 1,2-dimethylbenzene, 1,3-dimethylbenzene, 1,4-dimethylbenzene). The total concentration of the solution may range from 0.1 to 20 wt %. Some implementations may require the QD solvent exchange to match both the miscibility and deposition requirements of charge transport materials.

It should be appreciated that while the present disclosure primarily considers the QDs as core-shell (e.g., core 401, shell 402) QDs as shown in FIG. 4A, in some implementations, the QDs may not be of the core-shell type, or they may be of the core-multiple shell type (e.g., core 401, inner shell 403, outer shell 404) as shown in FIG. 4B. The non-core-shell type QDs may be made from one or more of the above-mentioned materials, and the QDs in accordance with the present disclosure may not include a core-shell configuration.

Figure 5A:
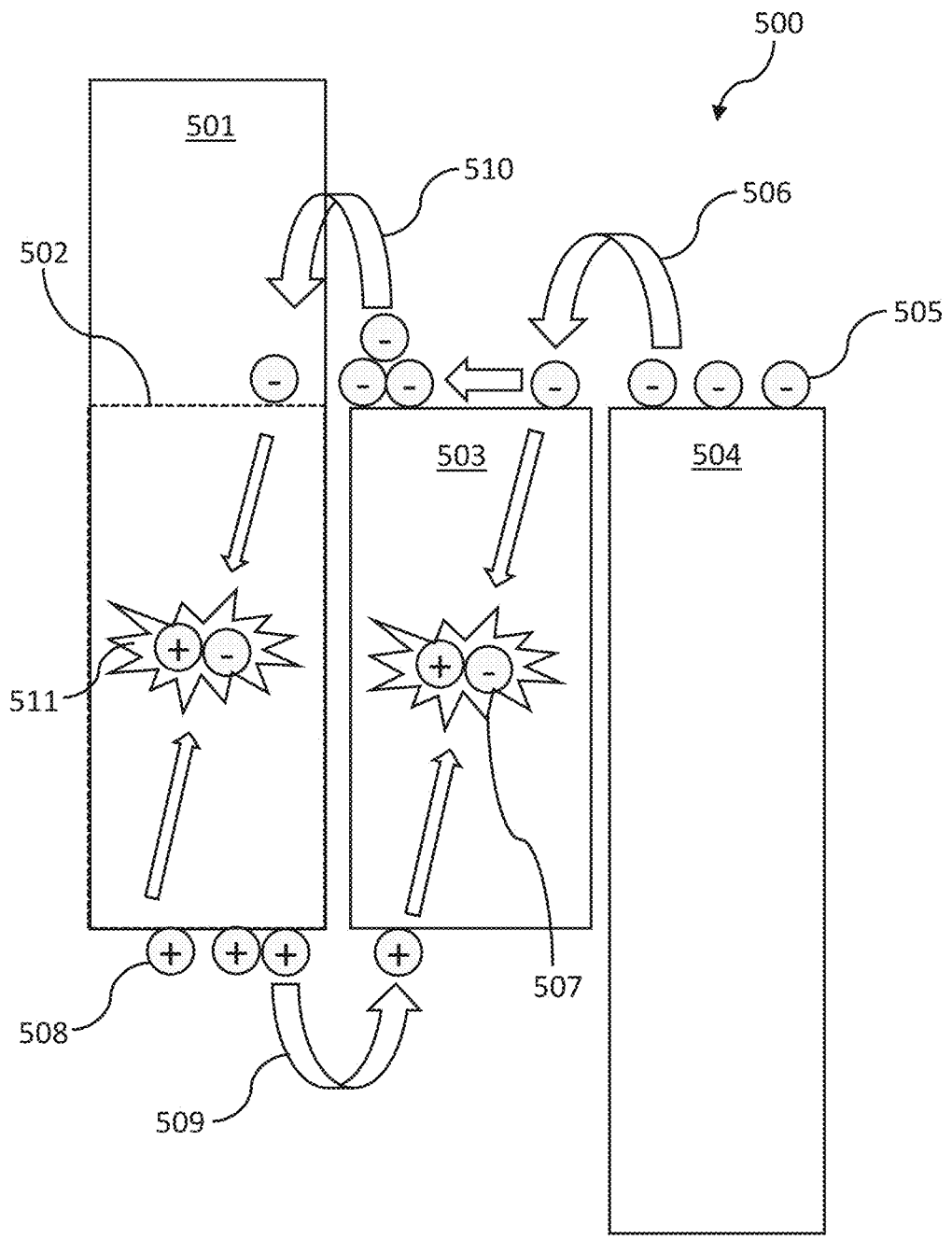
FIG. 5A illustrates an energy level diagram of a QD-LED CTL/EML interface in accordance with an exemplary implementation of the present disclosure.
Figure 5B:
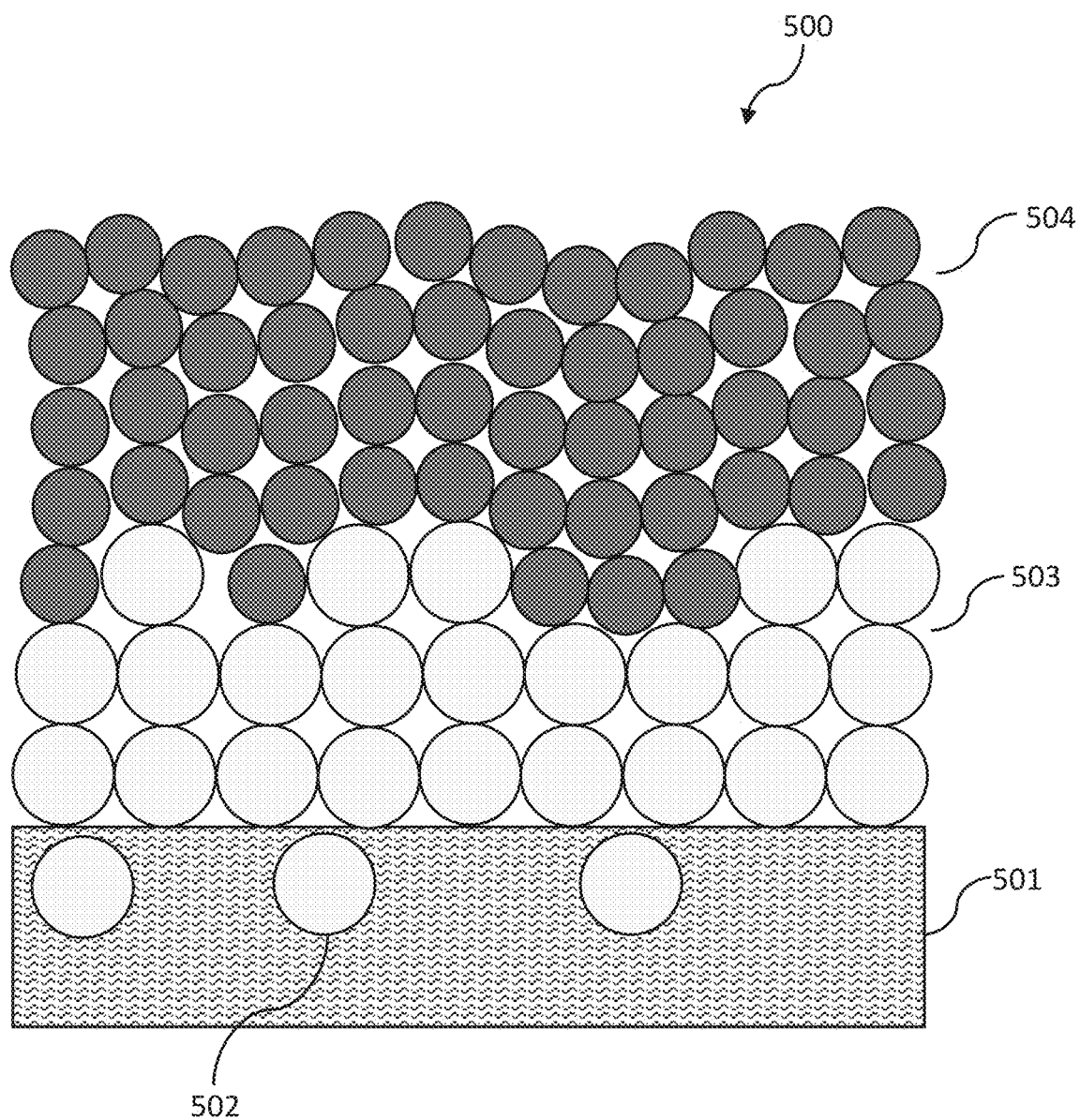
FIG. 5B illustrates a cut-away elevation view of a portion of a QD-LED CTL/EML interface in accordance with an exemplary implementation of the present disclosure.

Referring to FIGS. 5A and 5B, in one implementation, a portion of a QD-LED structure 500 includes an HTL 501 incorporating small quantity of QDs 502, in addition to an EML 503 and an ETL 504. Electron charges 505 moving 506 from the ETL 504 into the EML 503 will partially recombine 507 by emitting photons within the EML 503, while the hole charges 508 move 509 from the HTL 501 to the EML 503. Following the unbalanced charge injection into the QDs of the EML 503, a portion of the electron charges 505 will move 510 across the EML 503 into the QDs 502 within the HTL 501. Those electrons 505 radiatively recombine 511 with the holes 508 transported across the HTL 501. This recombination mechanism outside the EML 503 is expected to occur at driving voltages higher than turn-on voltage ($V_{ON}$) for the QD-LED 500. As shown in FIG. 5B, in this implementation, QDs 502 in the HTL 501 may be gradually distributed within the HTL 501 with a higher density closer to the EML 503 rather than the glass substrate 101 (e.g., as shown in FIG. 1).

Figure 6A:
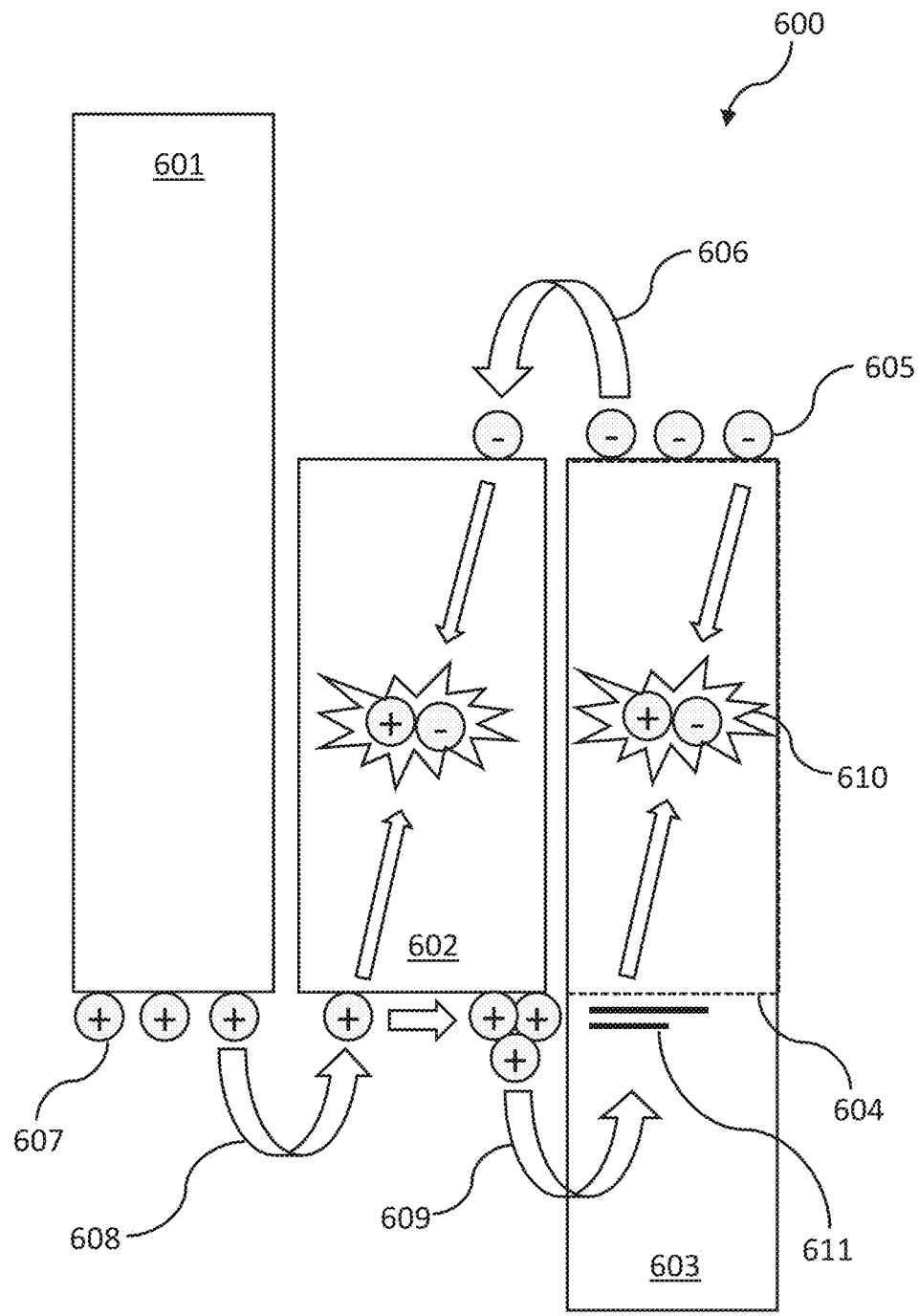
FIG. 6A illustrates an energy level diagram of a first alternative QD-LED CTL/EML interface in accordance with an exemplary implementation of the present disclosure.
Figure 6B:
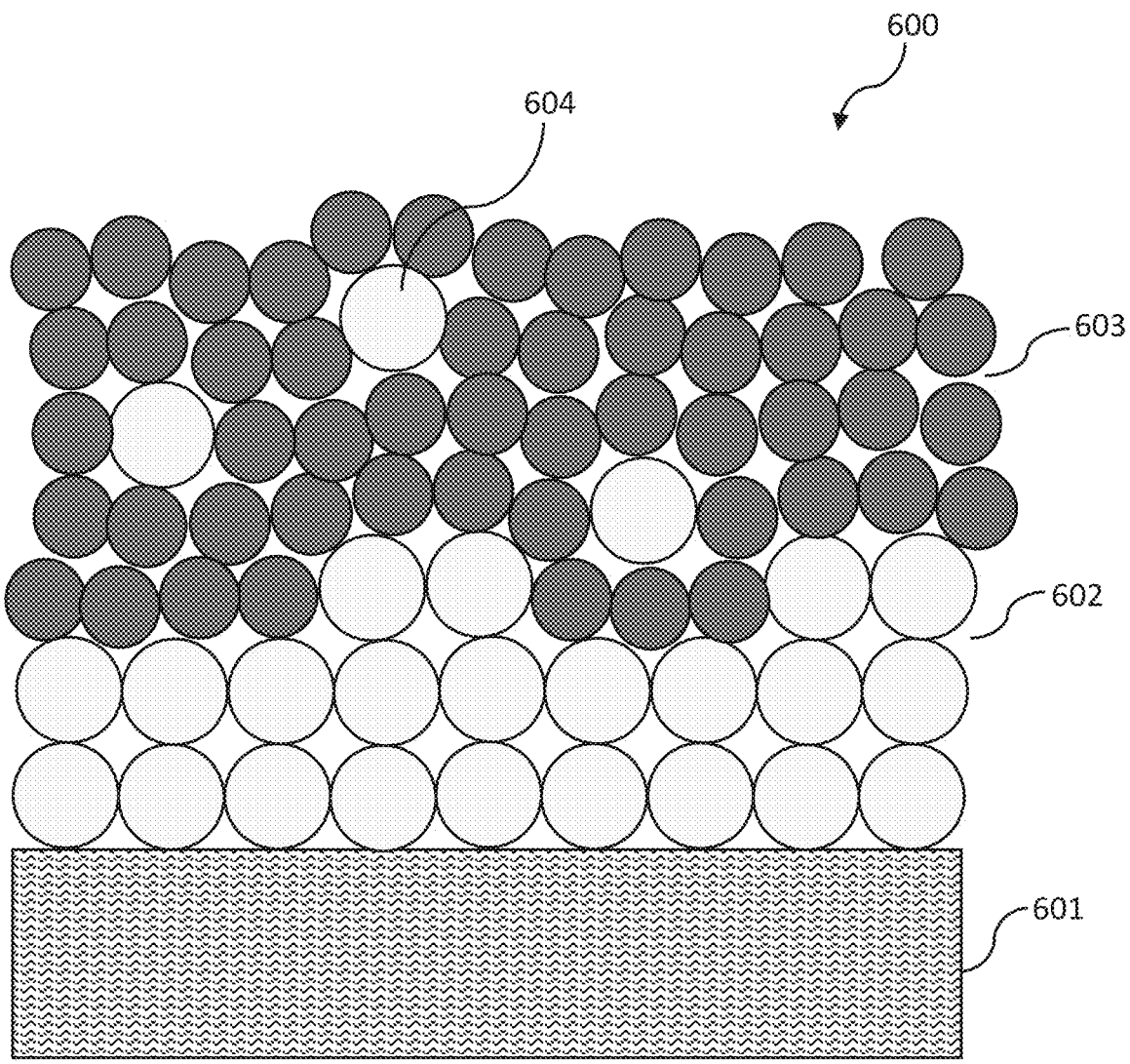
FIG. 6B illustrates a cut-away elevation view of a portion of the first alternative QD-LED CTL/EML interface in accordance with an exemplary implementation of the present disclosure.

Referring to FIGS. 6A and 6B, in another specific implementation, a portion of a QD-LED structure 600 includes an HTL 601, an EML 602, and an ETL 603 incorporating a small quantity of QDs 604. Electron charges 605 moving 606 from the ETL 603 into the EML 602 will partially recombine with hole charges 607 moving 608 from HTL 601 to the EML 602 emitting photons within the EML 602. Following the unbalanced charge injection into the EML 602, a portion of the holes 607 move 609 across the EML 602 and into the QDs 604 within the ETL 603. Those holes 607 radiatively recombine 610 with electrons 605 transported within the ETL 603. This recombination mechanism outside the EML 602 is expected to occur at driving voltages higher that turn-on voltage ($V_{ON}$) for the QD-LED 600. In some embodiments, the injection of excess holes 607 into the ETL 603 may be facilitated by the density of defect states 611 in the ETL 603 material. As shown in FIG. 6B, the QDs 604 are expected to be randomly distributed within the ETL 603.

Figure 7A:
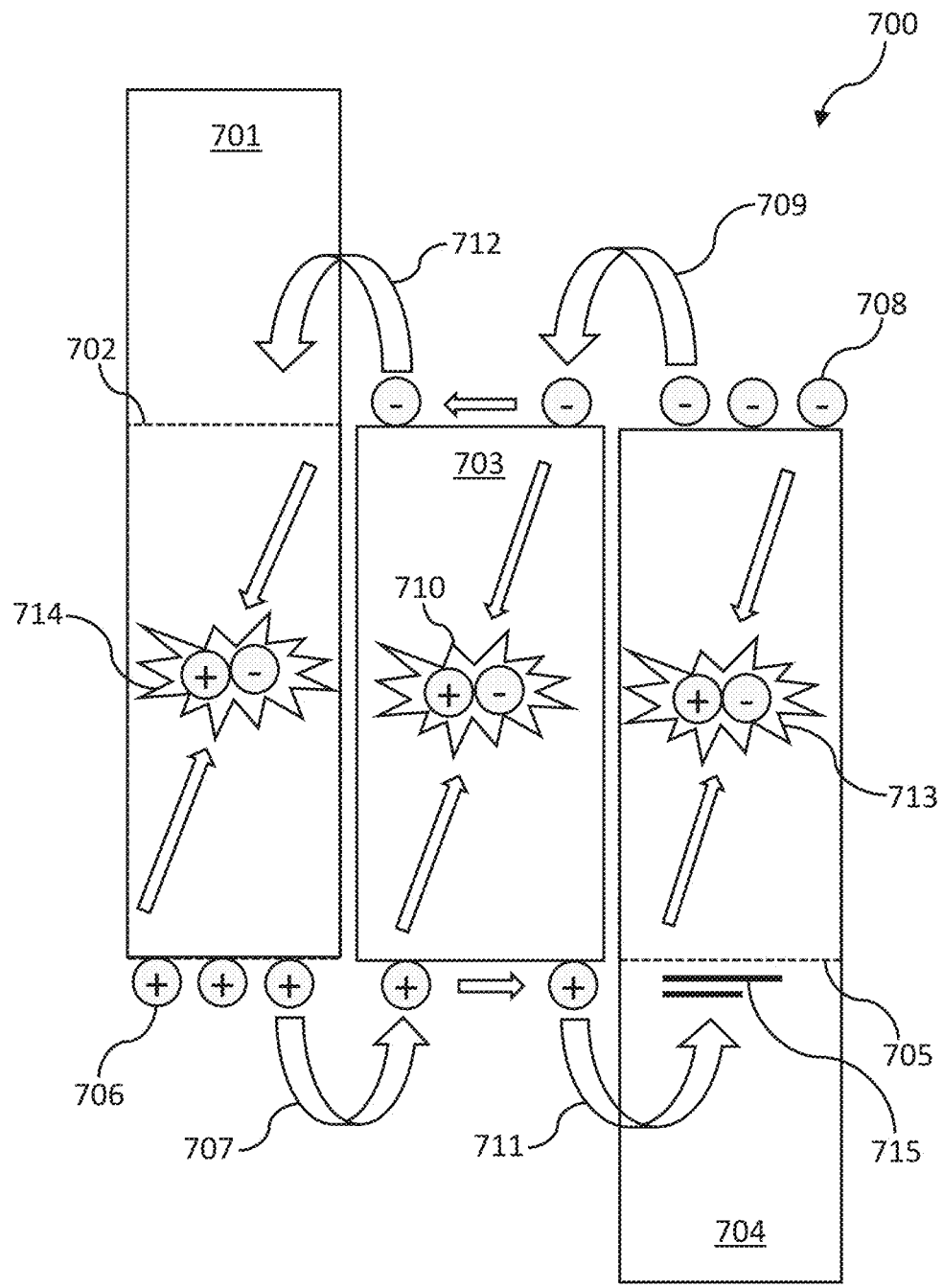
FIG. 7A illustrates an energy level diagram of a second alternative QD-LED CTL/EML interface in accordance with an exemplary implementation of the present disclosure.
Figure 7B:
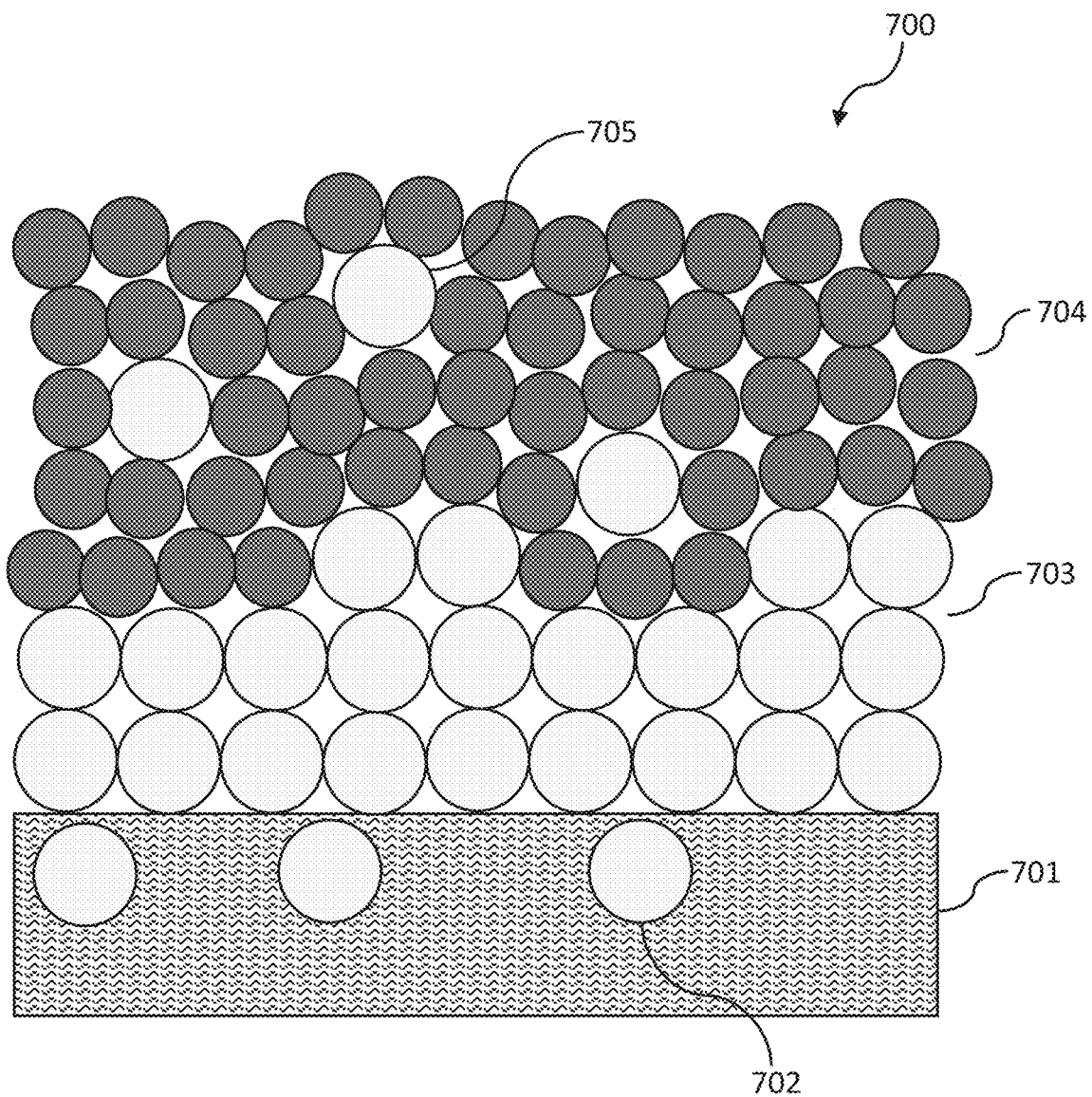
FIG. 7B illustrates a cut-away elevation view of a portion of the second alternative QD-LED CTL/EML interface in accordance with an exemplary implementation of the present disclosure.

Referring to FIGS. 7A and 7B, in another implementation, a portion of a QD-LED structure 700 includes an HTL 701 incorporating a small quantity of QDs 702, an EML 703, and an ETL 704 incorporating small amount of QDs 705. Holes 706 moving 707 from the HTL 701, and electrons 708 moving 709 from the ETL 704 into the EML 703, will partially recombine 710 within the emissive layer 703 and emit photons within the emissive layer 703. Following the unbalanced charge injection into the EML 703, the remaining holes 706 move 711 across the EML 703, and the remaining electrons 708 move 712 across the EML 703 into the QDs 705 within the ETL 704, and the QDs 702 within the HTL 701, respectively. Those holes 706 and electrons 708 radiatively recombine 713 with the electrons 708 transported within the ETL 704 and radiatively recombine 714 with the holes 706 transported across the HTL 701, respectively. This recombination mechanism outside the EML 703 is expected to occur at driving voltages higher than turn-on voltage ($V_{ON}$) for the QD-LED 700 and at the same time of the unbalanced charge mechanism into the EML 703. In some embodiments, the injection 711 of excess holes 706 into the ETL 704 may be facilitated by the density of defect states 715 into the ETL 704 material.

Referring to FIG. 7B, QDs 702 and 705 incorporated within the CTLs (e.g., HTL 701 and ETL 704) may be gradually distributed as follows: The QDs 702 in the HTL 701 may have a higher density closer to the EML 703 than to the glass substrate 101 (e.g., as shown in FIG. 1). The QDs 705 in the ETL 704 may be randomly distributed within the ETL 704. However, in some embodiments, the gradual distribution may differ from the one described above, since this depends strictly on the QD, and CTL materials used in various QD-LED structures.

In the various implementations described above, an inorganic CTL material may comprise metal and metal-based nanoparticles. An organic CTL material may comprise molecules or polymers that include carbon and hydrogen atoms and (but not limited to) heteroatoms such as nitrogen, sulfur, and oxygen. In general, an HTL is an organic CTL, and an ETL is an inorganic CTL in a QD-LED structure. However, some implementations may have HTLs and ETLs that are inorganic CTLs, HTLs and ETLs that are organic CTLs, or an inorganic HTL as a CTL, with an organic ETL as a CTL.

Referring to FIGS. 8-11, various distributions of QDs in CTLs are shown and described. In general, distributions may be random or gradual. In a random distribution, no distribution functions (e.g., the number of nanoparticles per unit volume in a phase/3D space) can define the distribution of QDs across the CTL. In contrast, a gradual distribution has a distribution function and the QD distribution function can be defined.

Figure 8:
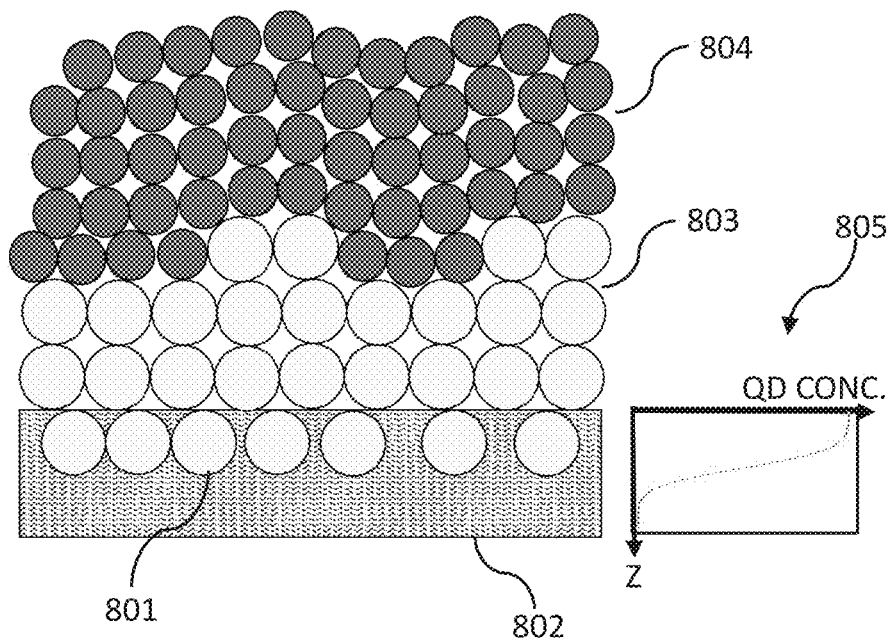
FIG. 8 illustrates a cut-away elevation view of a portion of a QD-LED CTL/EML interface, with QDs distributed gradually in the HTL in accordance with an exemplary implementation of the present disclosure.
Figure 9:
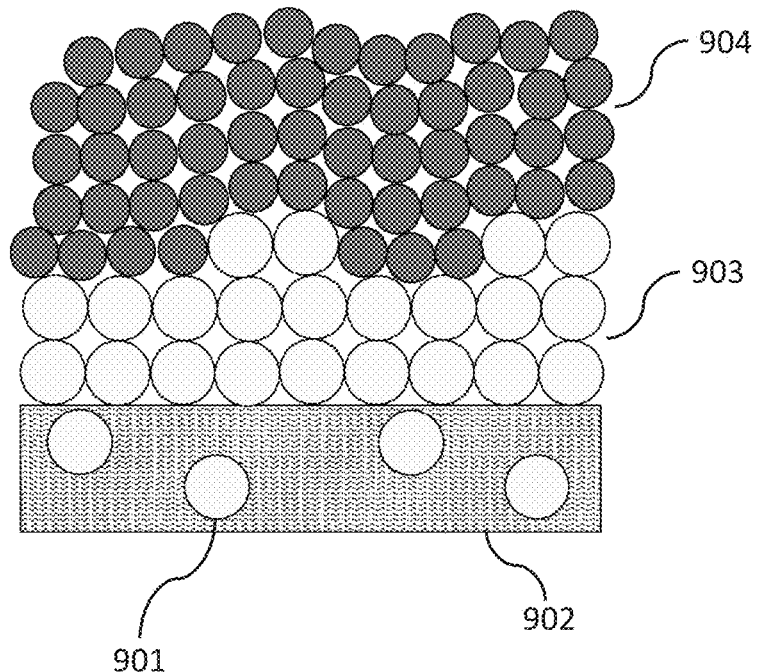
FIG. 9 illustrates a cut-away elevation view of a portion of a QD-LED CTL/EML interface, with QDs distributed randomly in the HTL in accordance with an exemplary implementation of the present disclosure.
Figure 10:
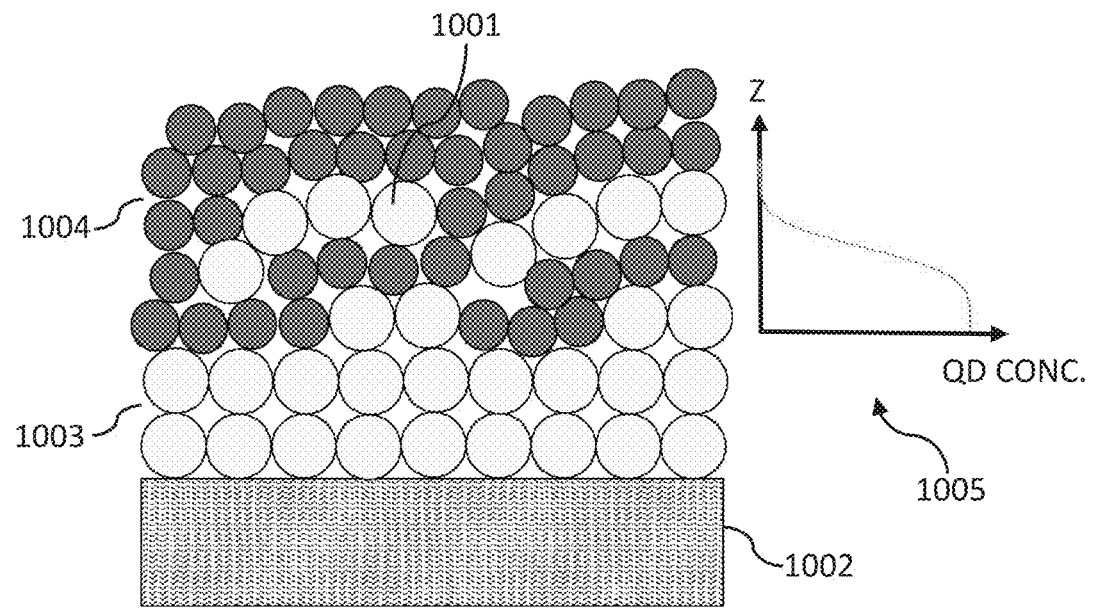
FIG. 10 illustrates a cut-away elevation view of a portion of a QD-LED CTL/EML interface, with QDs distributed gradually in the ETL in accordance with an exemplary implementation of the present disclosure.
Figure 11:
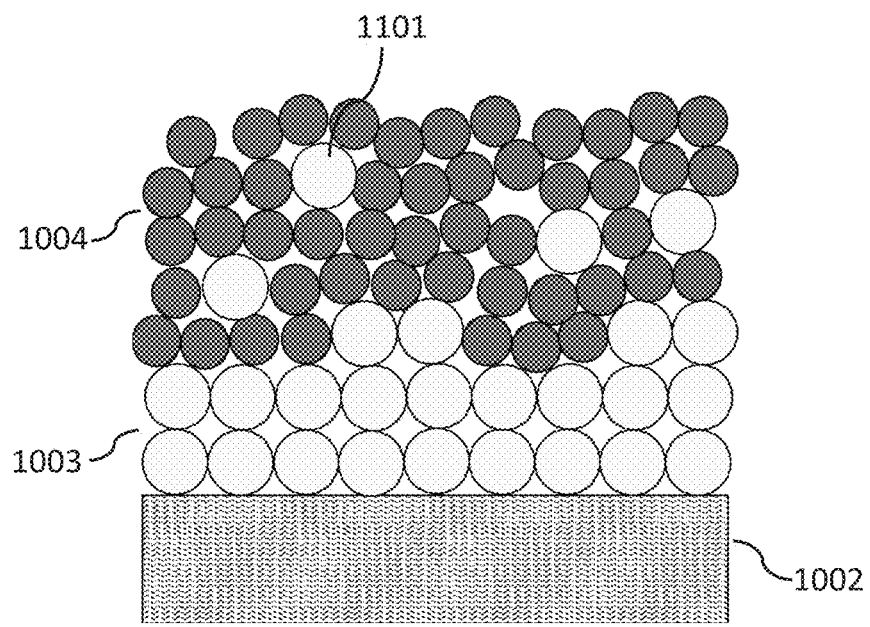
FIG. 11 illustrates a cut-away elevation view of a portion of a QD-LED CTL/EML interface, with QDs distributed randomly in the ETL in accordance with an exemplary implementation of the present disclosure.

FIG. 8 shows an example of QDs 801 gradually distributed in an HTL 802 (e.g., the QDs 801 are disposed closer to the EML 803, opposite the ETL 804). A distribution chart 805 shows a representation of the distribution across 1D space. As shown, distributed chart 805 indicates a concentration of QDs 801 relative to a position along a z-axis (e.g., vertically downward) within HTL 802, where the concentration of QDs 801 is highest at a boundary of HTL 802 and EML 803, and progressively lessens as the distance from that boundary increases. FIG. 9 shows an example of QDs 901 randomly distributed in an HTL 902, with the EML 903 and ETL 904 also shown. FIG. 10 shows an example of QDs 1001 gradually distributed in an ETL 1004 (e.g., the QDs 1001 are disposed closer to the EML 1003, opposite the HTL 1002). A distribution chart 1005 shows a representation of the distribution across 1D space. As illustrated, distributed chart 1005 indicates a concentration of QDs 1001 relative to a position along a z-axis (e.g., vertically upward) within ETL 1004, where the concentration of QDs 1001 is highest at a boundary of ETL 1004 and EML 1003, and progressively lessens as the distance from that boundary increases. FIG. 11 shows an example of QDs 1101 randomly distributed in an ETL 1104, with the EML 1103 and the HTL 1102 also shown. Other types of QD concentration distributions are also possible in other implementations.

From the present disclosure, various techniques may be used for implementing the concepts described in the present disclosure without departing from the scope of those concepts. While the concepts have been described with specific reference to certain implementations, a person of ordinary skill in the art may recognize that changes may be made in form and detail without departing from the scope of those concepts. As such, the described implementations are to be considered in all respects as illustrative and not restrictive. It should also be understood that the present disclosure is not limited to the implementations described, but rather many rearrangements, modifications, and substitutions are possible without departing from the scope of the present disclosure.

What is claimed is:

1. A light-emitting apparatus, comprising:
    a substrate;
    a first electrode layer disposed on the substrate;
    an emissive layer having a first set of quantum dots (QDs), the emissive layer electrically coupled to the first electrode layer;
    a second electrode layer electrically coupled to the emissive layer, the second electrode layer disposed opposite the first electrode layer, relative to the emissive layer;
    a first charge transport layer disposed between the emissive layer and the first electrode layer; and
    a second charge transport layer disposed between the emissive layer and the second electrode layer, wherein
    at least one of the first charge transport layer and the second charge transport layer comprises a second set of QDs, and
    a QD concentration in at least one of the first charge transport layer and the second charge transport layer ranges from 0.1 wt % to 20 wt %.

2. The light-emitting apparatus of claim 1, wherein QDs in the first set of QDs and QDs in the second set of QDs are structurally the same.

3. The light-emitting apparatus of claim 1, wherein at least one of the first charge transport layer and the second charge transport layer further comprises an organic semiconductor.

4. The light-emitting apparatus of claim 3, wherein the organic semiconductor is configured to have hole transport properties.

5. The light-emitting apparatus of claim 3, wherein the organic semiconductor is configured to have electron transport properties.

6. The light-emitting apparatus of claim 1, wherein at least one of the first charge transport layer and the second charge transport layer further comprises an inorganic semiconductor.

7. The light-emitting apparatus of claim 6, wherein the inorganic semiconductor is configured to have hole transport properties.

8. The light-emitting apparatus of claim 6, wherein the inorganic semiconductor comprises hole-transporting metal-oxide nanoparticles including a metal selected from Group V, Group VI, Group IX, Group X, or Group XI.

9. The light-emitting apparatus of claim 6, wherein the inorganic semiconductor is configured to have electron transport properties.

10. The light-emitting apparatus of claim 6, wherein the inorganic semiconductor comprises electron-transporting metal-oxide nanoparticles including a metal selected from Group I, Group IV, Group XII, Group XIII, or Group XIV.

11. The light-emitting apparatus of claim 6, wherein the inorganic semiconductor comprises metal-oxide nanoparticles having a nanoparticle size ranging from 3-nm to 20-nm.

12. The light-emitting apparatus of claim 1, wherein at least one of the first charge transport layer and the second charge transport layer further comprises metal-oxide nanoparticles equal in size to or smaller than QDs of the second set of QDs.

13. The light-emitting apparatus of claim 1, wherein at least one of the first charge transport layer and the second charge transport layer further comprises a plurality of charge transport sub-layers.

14. The light-emitting apparatus of claim 13, wherein each of the plurality of charge transport sub-layers comprises metal-oxide nanoparticles of a different size.

15. The light-emitting apparatus of claim 1, wherein at least one of the first charge transport layer and the second charge transport layer further comprises a blend of nanoparticles having different nanoparticle sizes.

16. The light-emitting apparatus of claim 15, wherein at least one of the blend of nanoparticles comprises a metal-oxide nanoparticle of a size equal to or smaller than QDs in the second set of QDs.

17. The light-emitting apparatus of claim 1, wherein the second set of QDs is randomly dispersed in at least one of the first charge transport layer and the second charge transport layer.

18. The light-emitting apparatus of claim 1, wherein the second set of QDs has a graduated dispersion in at least one of the first charge transport layer and the second charge transport layer.

19. A light-emitting apparatus, comprising:
a substrate;
a first electrode layer disposed on the substrate;
an emissive layer having a first set of quantum dots (QDs), the emissive layer electrically coupled to the first electrode layer;
a second electrode layer electrically coupled to the emissive layer, the second electrode layer disposed opposite the first electrode layer, relative to the emissive layer;
a first charge transport layer disposed between the emissive layer and the first electrode layer; and
a second charge transport layer disposed between the emissive layer and the second electrode layer,
wherein
at least one of the first charge transport layer and the second charge transport layer comprises a second set of QDs,
at least one of the first charge transport layer and the second charge transport layer further comprises a plurality of charge transport sub-layers, and
the plurality of charge transport sub-layers is deposited in an ascending order according to an electron-transporting metal-oxide nanoparticle size of each charge transport sub-layer.

* * * * *